United States Patent [19]
Gavish

[11] Patent Number: 5,734,274
[45] Date of Patent: Mar. 31, 1998

[54] FUSE-PROGRAMMABLE METHOD AND APPARATUS FOR PREVENTING A SEMICONDUCTOR DEVICE FROM OPERATING AT SPEED GREATER THAN AN APPROVED SPEED

[75] Inventor: Dan Gavish, Haifa, Israel

[73] Assignee: Intel Corporation, Santa Clara, Calif.

[21] Appl. No.: 574,718

[22] Filed: Mar. 11, 1996

[51] Int. Cl.$^6$ .......................... G01R 23/02; H01H 85/00
[52] U.S. Cl. ........................................ 327/48; 327/525
[58] Field of Search .................... 327/39, 40, 41, 327/42, 43, 44, 46, 45, 47, 48, 49, 31, 26, 20, 63, 64, 72, 90, 525; 326/37; 377/28, 39

[56] References Cited

U.S. PATENT DOCUMENTS

| | | | |
|---|---|---|---|
| 5,151,611 | 9/1992 | Rippey | 327/525 |
| 5,410,186 | 4/1995 | Bonaccio et al. | 327/525 |
| 5,410,196 | 4/1995 | Izuta | 327/48 |
| 5,485,105 | 1/1996 | Harward et al. | 327/525 |
| 5,508,638 | 4/1996 | Cowles et al. | 327/525 |
| 5,592,111 | 1/1997 | Wong et al. | 327/48 |

OTHER PUBLICATIONS

PCT Search Report, mailed May 27, 1997.

*Primary Examiner*—Timothy P. Callahan
*Assistant Examiner*—My-Trang Nu Ton
*Attorney, Agent, or Firm*—Blakely, Sokoloff, Taylor & Zafman

[57] ABSTRACT

A clock frequency limiting circuit is disclosed. The clock frequency limiting circuit allows a semiconductor device to be fabricated, packaged and tested before the maximum clock frequency is set. The maximum clock frequency is set by burning a bank of on-chip fuses. The clock frequency limiting circuit counts clock cycles of an applied clock signal for a predetermined amount of time. A comparator compares the maximum clock frequency in the fuse bank and the counted clock cycles. A violation "kill" signal is asserted if the counted clock cycles exceeds the set maximum clock frequency.

5 Claims, 3 Drawing Sheets

FUSE-PROGRAMMABLE METHOD AND APPARATUS FOR PREVENTING A SEMICONDUCTOR DEVICE FROM OPERATING AT SPEED GREATER THAN AN APPROVED SPEED

FIELD OF THE INVENTION

The present invention relates to the field of semiconductor devices. In particular, the present invention discloses a method and apparatus for detecting if a semiconductor device is being operated with a clock frequency greater than an approved maximum clock rate.

BACKGROUND OF THE INVENTION

Semiconductor devices are often created and sorted into different bins depending on how fast of a clock frequency the semiconductor device can tolerate. For example, different batches of the same microprocessor design may be capable of operating at varying clock frequencies such as 75, 90, and 100 megahertz. The microprocessors that are capable of operating at the higher clock frequencies command higher prices since such microprocessors are able to compute results faster.

The clock signal for most semiconductor devices is usually generated by a circuit located on a circuit board coupled to the semiconductor device and applied to the semiconductor device through a clock input line (an "off-chip" clock source). Since most semiconductor manufacturers do not sell semiconductor devices nor complete products to end users, the semiconductor manufacturer has no direct control over the frequency of the clock signal that is applied to the semiconductor device. Specifically, the companies that incorporate semiconductor devices into electrical products determine how the semiconductor device will be used. In some cases, a semiconductor purchaser may apply a higher than approved clock frequency to the semiconductor device to obtain improved performance. This may improve performance temporarily, but the semiconductor device may not operate properly for long periods of time. The semiconductor device may eventually overheat or a subtle race condition may cause inaccurate results.

If the semiconductor device malfunctions due to faster than approved a clock signal applied to the semiconductor device, then the end customer may blame the semiconductor manufacturer instead of the electrical product manufacturer. Thus, the reputation of the semiconductor manufacturer may be damaged through no fault of their own. Accordingly, there is a need to limit the speed of the clock signal that can be applied to semiconductor devices in order to protect the reputation of the semiconductor manufacturer.

SUMMARY AND OBJECTS OF THE INVENTION

It is therefore an object of the present invention to limit the speed at which a semiconductor device can operate.

It is a further objective of the present invention to allow a semiconductor device to be fabricated, packaged and tested before the maximum clock frequency is set. These and other objectives are achieved by the clock frequency limiting circuit of the present invention.

The clock frequency limiting circuit of the present invention consists of five different sub-circuits, a reference timing circuit, a clock cycle counter circuit, a comparator circuit, a fuse programmable speed limit logic circuit, and a filter circuit. The reference timing circuit generates a short pulse which is used to measure the applied clock signal. The reference timing circuit generates a pulse that activates the counter circuit that counts clock cycles for a defined pulse width. The speed limit logic defines a maximum number of clock cycles that should have been counted during the timing pulse generated by the reference timing circuit.

A comparator compares the maximum clock frequency set by the speed limit logic and the measured clock frequency measured by the counter circuit. The output of the comparator is applied to a filter circuit. The filter circuit determines whether the measured clock frequency has exceeded the speed limit set by the speed limit logic for a sufficient amount of time to be sure that the device is being operated at a frequency above its designed frequency. If the semiconductor device is being operated at a frequency higher than its design frequency then the filter circuit activates a "kill" signal which disables the semiconductor device.

Other objects, features, and advantages of the present invention will be apparent from the accompanying drawings and from the detailed description which follows below.

BRIEF DESCRIPTION OF THE DRAWINGS

The objects, features and advantages of the present invention will be apparent to one skilled in the art, in view of the following detailed description in which.

DETAILED DESCRIPTION

A method and apparatus for limiting the maximum clock frequency at which a semiconductor device may operate is disclosed. In the following description, for purposes of explanation, specific nomenclature is set forth to provide a thorough understanding of the present invention. However, it will be apparent to one skilled in the art that these specific details are not required in order to practice the present invention. In other instances, well known circuits and devices are shown in block diagram form in order not to obscure the present invention.

The Clock Frequency Limiting Circuit

Figure 1:
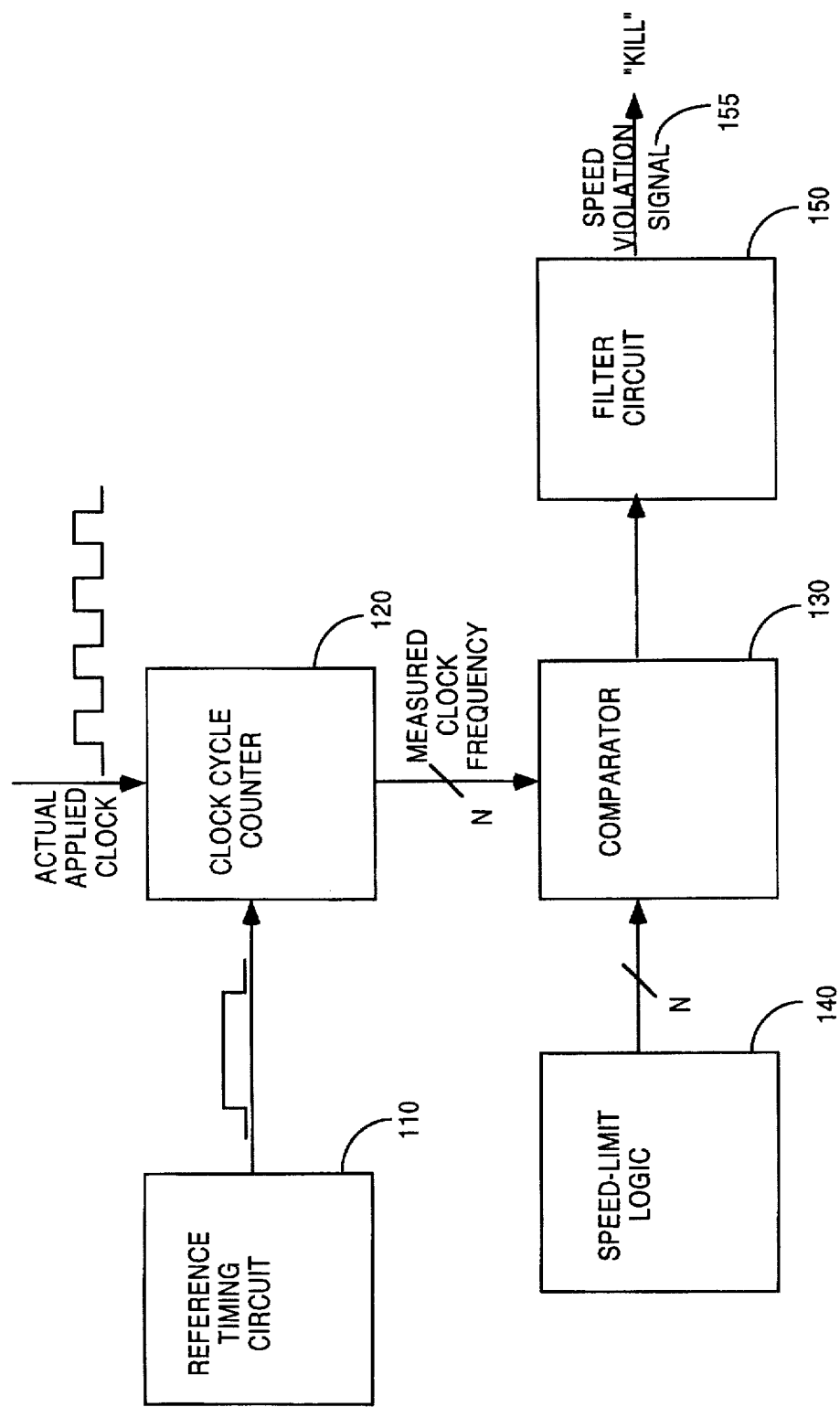
FIG. 1 illustrates an overall block diagram of the entire clock frequency limiting circuit.

FIG. 1 illustrates an overall functional block diagram of one implementation of the present invention. The circuit illustrated in FIG. 1 consists of five sub-circuits: the reference timing circuit 110, a clock cycle counter 120, a speed limit logic unit 140, a comparator 130, a filter circuit 150.

The reference timing circuit 110 is used to generate a time reference used to measure the speed of the incoming clock. The reference timing circuit 110 may consist of a resistor-capacitor timing circuit created either on the semiconductor device itself or external to the semiconductor die. Alternatively, the reference timing circuit 110 may consist of a clock crystal embedded in a multichip module package. The reference timing circuit 110 generates a timing pulse of a known width. For purposes of this example embodiment, a timing pulse of one microsecond will be used although other timing pulse lengths could be used.

The timing pulse generated by the reference timing circuit 110 is used to activate the clock cycle counter 120. The clock cycle counter 120 counts the number of clock cycles that occur on the applied clock signal from the external clock source during the timing pulse generated by the reference timing circuit 110. The number of counted clock cycles is applied to comparator 130.

Speed limit logic 140 is used to define a maximum number of clock cycles that should be detected during the timing pulse generated by the reference timing circuit 110. Since the reference timing circuit 110 may not be extremely accurate, the value in generated by the speed limit logic 140 should be a little greater than the actual maximum number of clock cycles. The speed limit logic 140 outputs a number that specifies the maximum number of clock cycles that should be counted during the timing pulse generated by the reference timing circuit 110.

The number output by the speed limit logic 140 is applied to the comparator 130. The comparator 130 compares the number of clock cycles counted by clock counter 120 with the set maximum number of cycles output by speed limit logic 140. The results of the comparison made by comparator 130 is applied to filter circuit 150.

Filter circuit 150 filters the output of the comparator 130 to determine if the applied clock signal was merely temporarily over the maximum frequency or if the applied clock signal is permanently over the maximum frequency. Thus, any transient noise or temporary clock speed increases will be ignored ("filtered-out") by filter circuit 150. If the filter circuit 150 determines that the applied clock signal is permanently over the maximum allowed clock frequency, then the filter circuit 150 outputs a speed violation "kill" signal 155.

The speed violation signal 155 can be applied to any circuit that is used to limit the operation of the semiconductor device. For example, the speed violation "kill" signal may be connected to reset line that will reset the semiconductor device if a violation is detected. Alternatively, the speed violation "kill" signal may be coupled to a circuit that inserts wait states and thus reduces performance of the semiconductor device.

The Speed Limit Logic

Semiconductor devices are usually not fully tested until they are completely assembled and sealed within a package. Thus, any system that is used to limit the clock frequency speed at which the device may operate should be adjustable such that the maximum allowed clock frequency can be set after the semiconductor device has been fully manufactured and tested.

Figure 2:
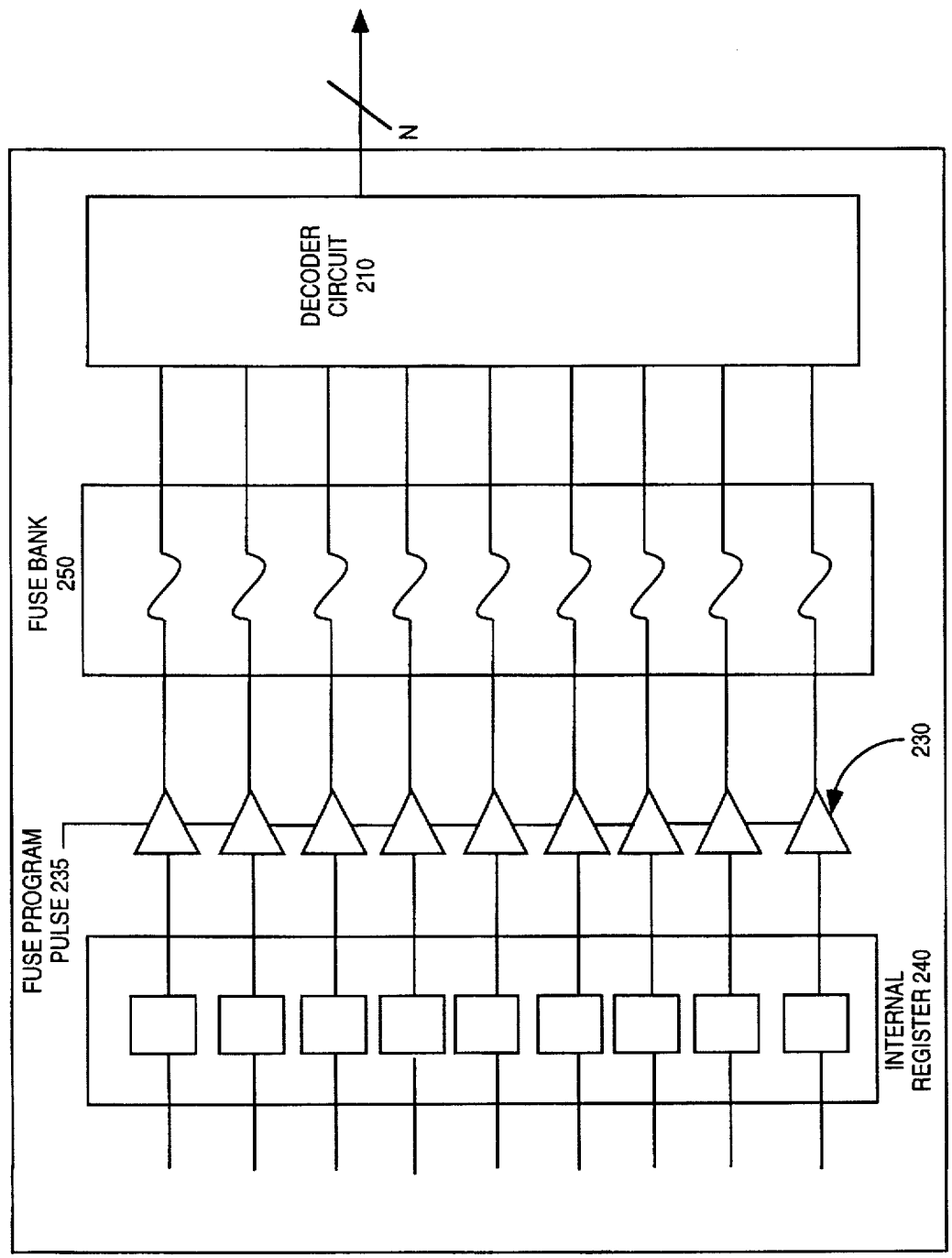
FIG. 2 illustrates a first embodiment of a speed limit logic circuit that uses an internal register to define the maximum approved clock frequency.

FIG. 2 illustrates a first embodiment of a speed limit logic circuit that can be set after the semiconductor device has been manufactured and tested. The embodiment of FIG. 2 uses an internal register in a semiconductor device to set the speed limit for the semiconductor device. The speed limit circuit of FIG. 2 consists of an internal register 240, a set of drivers 230, a fuse bank 250, and a decoder circuit 210. The internal register 240 is used to store the speed limit temporarily when it is to be programmed. After the speed limit has been stored in the internal register 240 a programming pulse is applied to fuse program pulse line 235 such that drivers 230 will burn out the fuses in fuse bank 250 as specified by the internal register 240. After the fuses have been burnt out of fuse bank 250, the correct speed is decoded from the output of fuse bank 250 using decoder circuit 210, the speed limit is output on the N output lines and passed onto the comparator.

Figure 3:
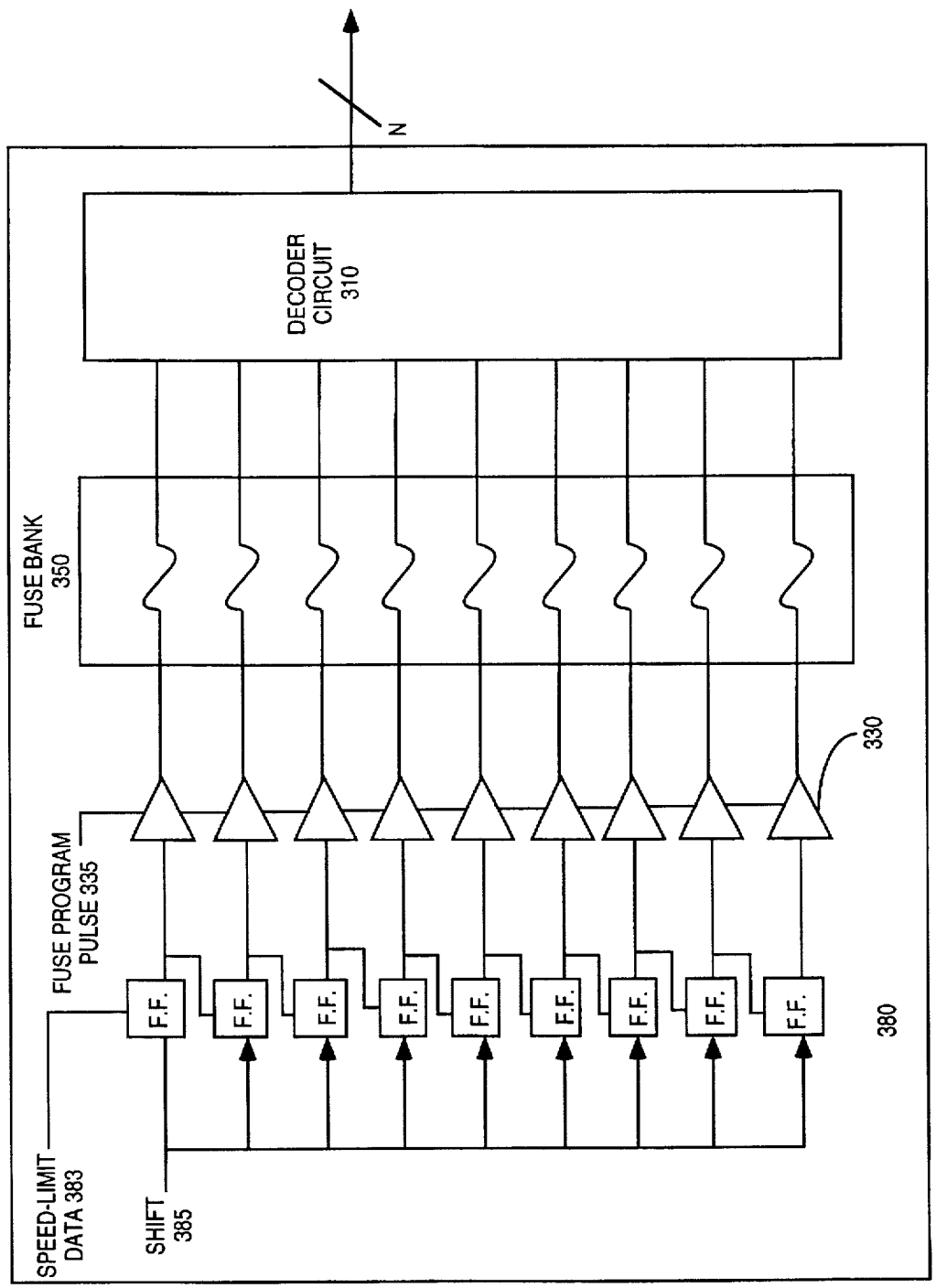
FIG. 3 illustrates a second embodiment of a speed limit logic circuit that uses a speed limit that is serially shifted into a speed limit logic for programming.

FIG. 3 illustrates an alternate embodiment the speed limit circuit. The speed limit circuit of FIG. 3 the internal register has been replaced with a set of flip flops which are wired in series. This enables the speed limit data to be fed onto a single serial speed limit data line 383. A shift line 385 shifts the data through the flip-flops 380 such that the speed limit can be loaded through a single pin. After the speed limit has been serially shifted into the flip-flops 380, a programming pulse is applied to fuse program pulse line 335 such that drivers 330 will burn out the fuses in fuse bank 350 as specified by the flip-flops 380. After the fuses have been burnt out of fuse bank 350, the correct speed is decoded from the output of fuse bank 350 using decoder circuit 310, the speed limit is output on the N output lines and passed onto the comparator of the clock frequency limiting circuit.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An electrical circuit for determining if a clock signal exceeds a defined clock frequency limit, said electrical circuit comprising:

a reference timing circuit for generating a timing reference;

a counter circuit activated by said reference timing circuit for counting a number of clock cycles of said clock signal;

a programmable speed limit logic for outputting a reference number of clock cycles as defined by said defined clock frequency limit; and a comparison circuit for comparing said number of clock cycles of said clock signal counted by said counter circuit with said reference number of clock cycles to determine if said clock frequency limit is exceeded.

2. The reference circuit as claimed in claim 1 wherein said comparison circuit outputs a violation signal to limit the operation of said semiconductor device if a speed violation occurs for a predetermined amount of time.

3. The electrical circuit as claimed in claim 1 wherein said programmable speed limit logic comprises a set of fuses.

4. A method for preventing a semiconductor device from being operated at an applied clock frequency greater than an approved clock frequency limit, said method comprising the steps of:

manufacturing said semiconductor device;

testing said semiconductor device to determine said approved clock frequency limit;

programming said approved clock frequency limit into a programmable speed limit logic;

generating an applied clock signal as a timing reference within said semiconductor device;

counting the number of clock cycles generated during said applied clock signal;

comparing said approved clock frequency limit with said number of clock cycles counted during said applied clock signal; and generating a violation signal if said number of clock cycles counted during said applied clock signal exceeds said approved clock frequency limit.

5. The method for preventing a semiconductor device from being operated at an applied clock frequency greater than an approved clock frequency limit as claimed in claim 4 wherein said step of programming said approved clock frequency limit into said programmable speed limit logic comprises burning a set of fuses that store said approved clock frequency limit.

* * * * *